United States Patent
Chen et al.

(10) Patent No.: US 7,723,014 B2
(45) Date of Patent: May 25, 2010

(54) SYSTEM AND METHOD FOR PHOTOLITHOGRAPHY IN SEMICONDUCTOR MANUFACTURING

(75) Inventors: Kuei Shun Chen, Hsin-Chu (TW); Chin-Hsiang Lin, Hsin-Chu (TW); Tsai-Cheng Gau, HsinChu (TW); Chun-Kung Chen, Hsin-Chu (TW); Hsiao-Tzu Lu, Hsinchu (TW); Fu-Jye Liang, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1023 days.

(21) Appl. No.: 11/259,589

(22) Filed: Oct. 26, 2005

(65) Prior Publication Data

US 2007/0092840 A1    Apr. 26, 2007

(51) Int. Cl.
*G03F 7/20* (2006.01)
(52) U.S. Cl. .................................... 430/311
(58) Field of Classification Search ............... 430/311, 430/5
See application file for complete search history.

(56) References Cited

U.S. PATENT DOCUMENTS

| | | | |
|---|---|---|---|
| 4,869,999 A | 9/1989 | Fukuda et al. | |
| 4,937,619 A | 6/1990 | Fukuda et al. | |
| 5,742,376 A | 4/1998 | Makinouchi | |
| 5,825,043 A | 10/1998 | Suwa | |
| 6,118,516 A * | 9/2000 | Irie et al. | 355/53 |
| 6,218,077 B1 | 4/2001 | Jin | |
| 6,278,515 B1 | 8/2001 | Knight et al. | |
| 6,361,909 B1 | 3/2002 | Gau et al. | |
| 6,391,677 B1 | 5/2002 | Kamatsuki | |
| 6,586,160 B2 | 7/2003 | Ho et al. | |
| 6,784,975 B2 | 8/2004 | Boettiger et al. | |
| 2005/0100831 A1* | 5/2005 | Finders et al. | 430/322 |
| 2005/0237508 A1* | 10/2005 | Eib et al. | 355/67 |

FOREIGN PATENT DOCUMENTS

JP    2000-082663    3/2000

OTHER PUBLICATIONS

Japanese Patent Office, Office Action mailed Oct. 6, 2009, Application No. 2006-290980, 4 pages.

* cited by examiner

*Primary Examiner*—Brittany Raymond
(74) *Attorney, Agent, or Firm*—Haynes and Boone, LLP

(57) ABSTRACT

A method for photolithography in semiconductor manufacturing includes providing a substrate for a wafer and providing a mask for exposing the wafer. The wafer is exposed by utilizing a combination of high angle illumination and focus drift exposure methods.

6 Claims, 9 Drawing Sheets

SYSTEM AND METHOD FOR PHOTOLITHOGRAPHY IN SEMICONDUCTOR MANUFACTURING

BACKGROUND

The present disclosure relates generally to the manufacturing of semiconductor devices, and more particularly to a photolithography process in semiconductor manufacturing.

Since the inception of the semiconductor industry, photolithography has been used for forming the components of integrated circuits. The continued increase in the density of components that can be placed on a chip has been largely due to advances in photolithography, and especially the ever decreasing wavelengths of radiation. As long as the critical dimension of the components is greater than the wavelength of the radiation used to expose the photoresist, advances in the art do not require any significant changes of the masks.

However, when the wavelength of the imaging radiation is larger than the critical dimension, the effects of diffraction, though always present, become sufficiently prominent to introduce noticeable distortions into the projected images. Those distortions are particularly sensitive to the distances between the various features in the image pattern and are frequently referred to as "proximity effects."

Another problem associated with photolithography at wavelengths close to the critical dimensions is depth of focus (DOF). In particular, when the DOF is less than the thickness of the resist being exposed, image sharpness will be lost. In practice, because of diffraction effects, the resulting image often becomes a blurred circle.

When resolution is not a concern, DOF can be increased by restricting the incoming light to the center of the lens, thus reducing the angle of the light cone so that focused rays travel further before leaving the blurred circle. However, when resolution is also a consideration, that solution is no longer acceptable.

Traditionally, approaches for increasing DOF have been directed toward bringing both densely packed and isolated contact holes into simultaneous focus. However, since the increase of DOF for densely packed contact holes often result in the decrease of the DOF for isolated contact holes, such efforts frequently result in unfocused images. For example, to balance respective DOFs for densely packed and isolated contact holes, previously available art utilizes multiple or continuing exposures with conventional illumination to enhance DOF. However, such an approach results in poor DOF for dense holes.

Therefore, it is desirable to improve the existing lithography system and method.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
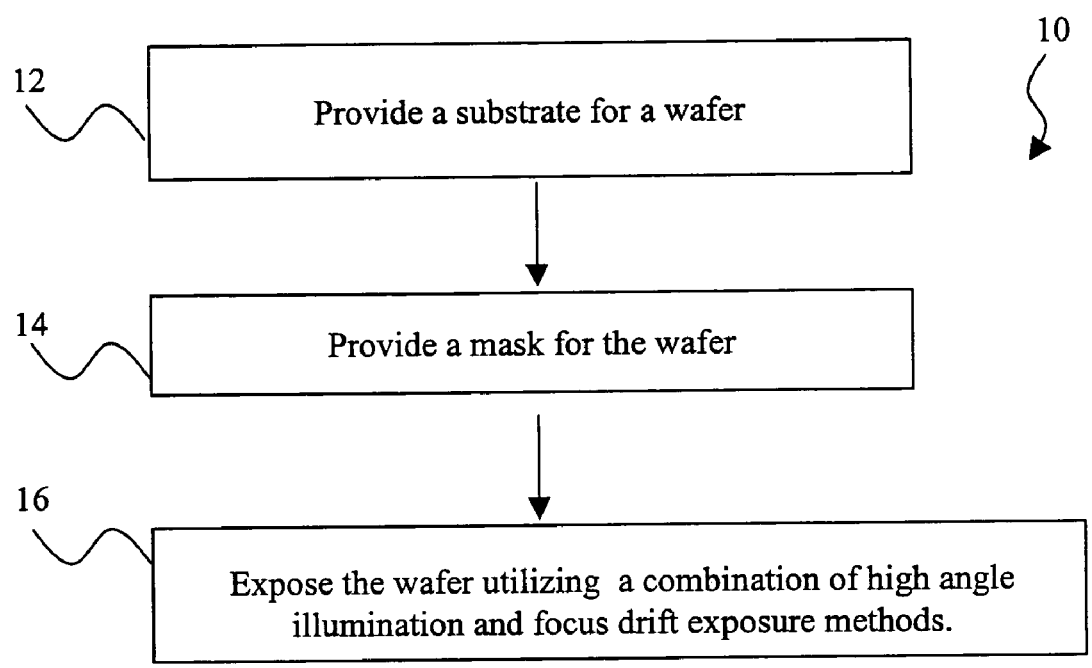
FIG. 1 illustrates a method of photolithography for implementing one or more embodiments of the present invention.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

The present disclosure presents a new approach of lithography that utilizes a combination of high angle illumination and focus drift exposure methods. The high angle illumination method including off-axis illumination will be further described below in connections with FIGS. 3-6. The focus drift exposure, which may include multiple exposures and/or wafer/mask titling as well as dry or wet lithography, will be further described below.

Referring now to FIG. 1, shown therein is a simplified photolithography method 10 for implementing one or more embodiments of the present invention. The method initiates with step 12, which provides a photo-resist coated substrate. Pursuant to step 14, a mask for exposing the wafer is provided. Finally, pursuant to step 16 of the method 10, the wafer is exposed utilizing a combination of high angle illumination and focus drift exposure methods.

The method 10 may be utilized in the manufacturing of a variety of semiconductor devices, such as memory devices (including but not limited to a static random access memory (SRAM)), logic devices (including but not limited to a metal-oxide semiconductor field-effect transistor (MOSFET)), and/or other devices. The method 10 begins at step 12 wherein a wafer is provided.

Figure 2:
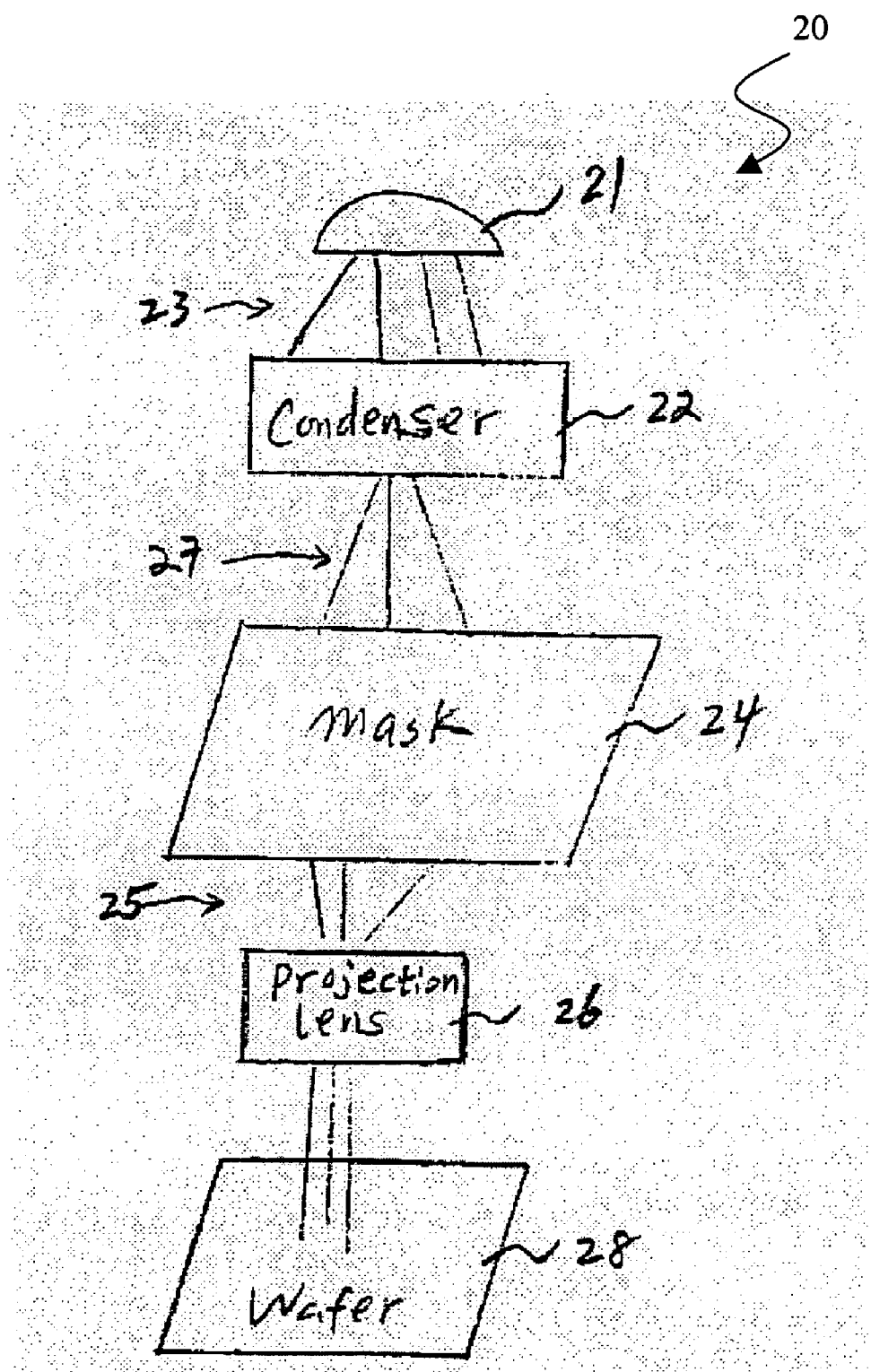
FIG. 2 illustrates a photolithography system for implementing one or more embodiments of the present invention.

Referring now to FIG. 2, a wafer 28 used in step 12 of the method 10 can be illustrated as part of a simplified exemplary lithography system 20. In this embodiment, a light source 21 emits light beams 23, which are condensed by a condenser 22. The wavelength of the light source is less than 250 nm, and in the present embodiments about 248 nm, 193 nm, or 157 nm. As a result, a mask 24, which includes patterns, is illuminated uniformly by light beams 27. After passing through the mask 24, light beams 25 are focused by a projection lens 26 prior to being projected onto the wafer 28.

It is noted since the lithography system 20 is known in the art, most components thereof will not be further described herein.

Pursuant to step 16 of the method 10, the wafer 28 is exposed utilizing a combination of high angle illumination and focus drift exposure methods, each of which will be described below.

The high illumination method will now be further described. In one example, the light source 21 may be adjusted by methods known in the art to provide high angle illumination as illustrated in FIGS. 3-6.

Figure 3:
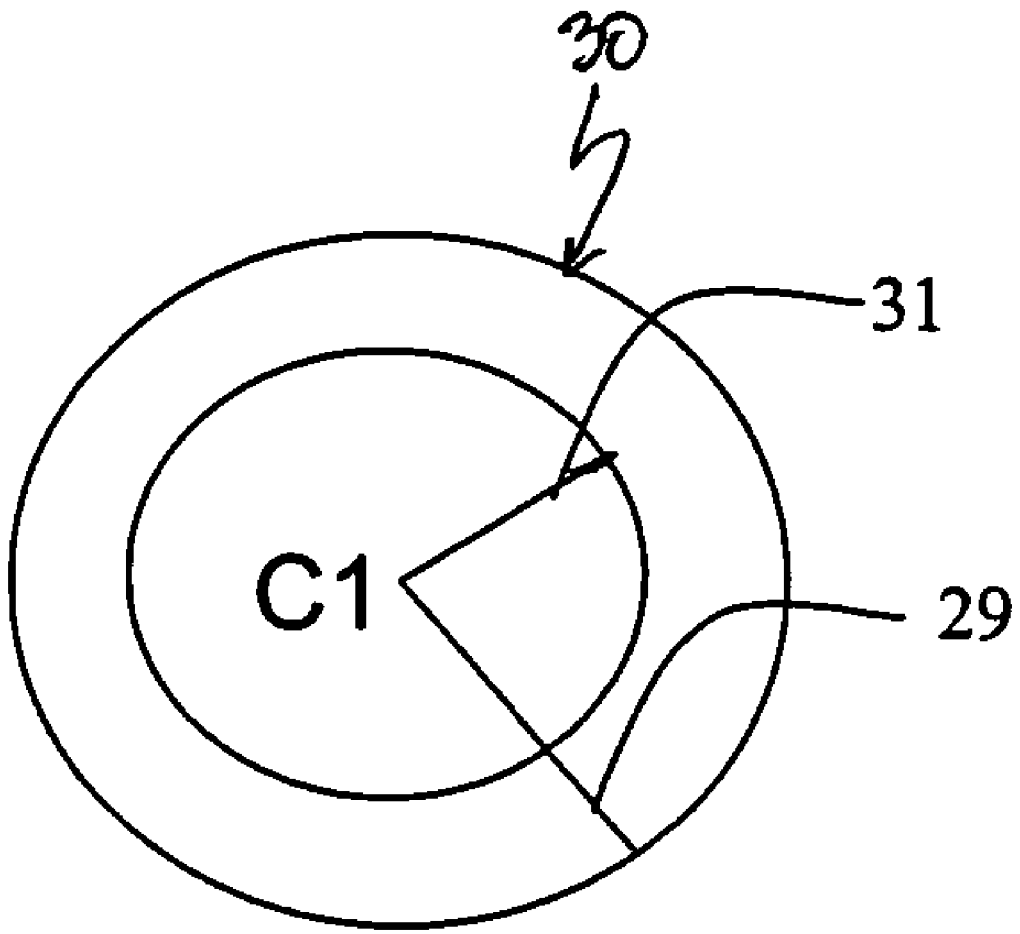
FIGS. 3-6 illustrate illumination areas for the photolithography system of FIG. 2 for implementing one or more embodiments of the present invention.

Referring now to FIG. 3, in one example, a substantially circular area C1 has been formed within an illumination area 30, with a radius 29 of about 1 sigma. The area C1, which may have a radius 31 that is approximately at least 0.65 sigma, may be represented by a filter or any other devices, and may possess a light transmission rate of approximately between about 0% and about 100%. In the present embodiment, the light transmission rate is approximately between about 20% and about 100%.

Figure 4:
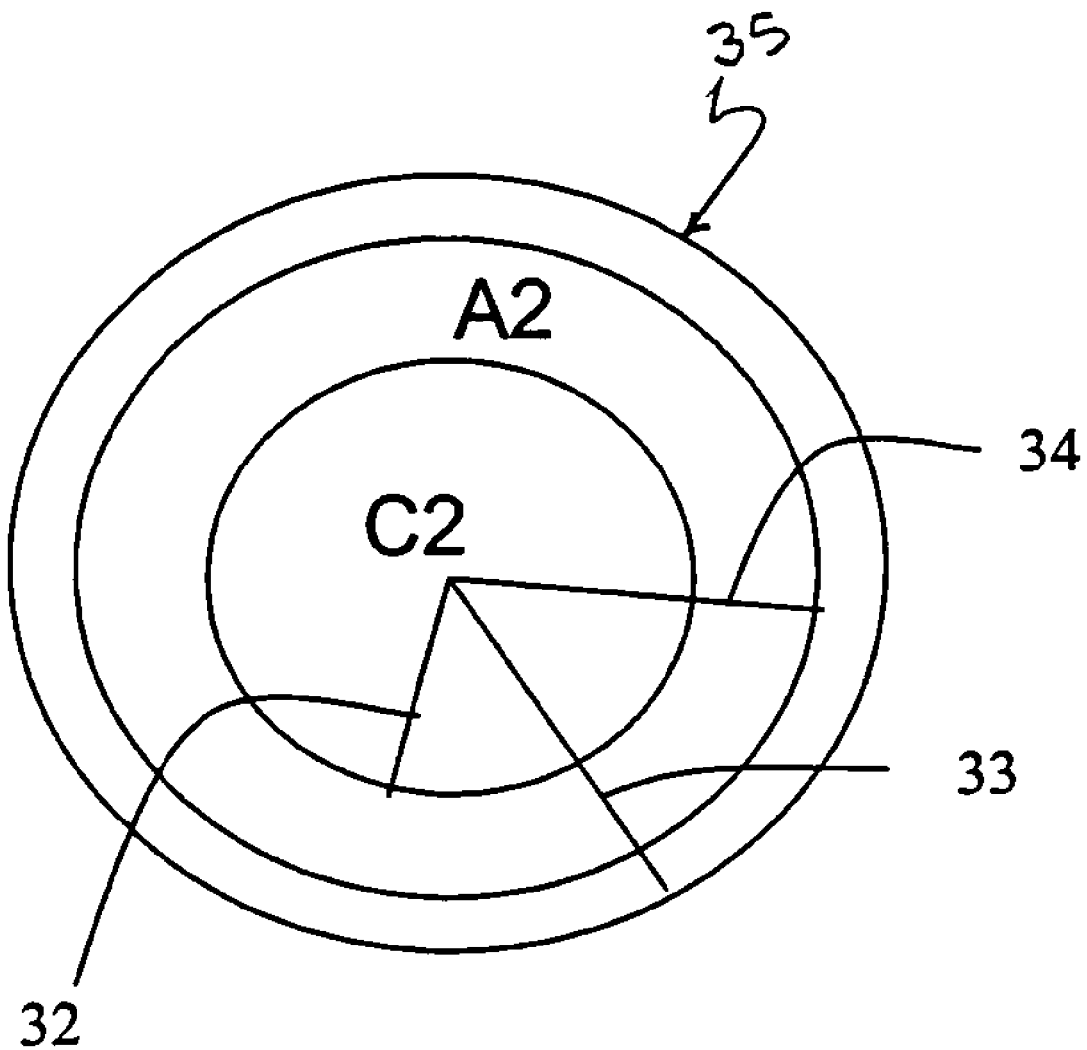

Referring now to FIG. 4, in another example, a first substantially circular area C2 and a second adjacent torus-shaped area A2 adjacent to the first substantially circular area C2 have been formed within an illumination area 35 with a radius 33 of about 1 sigma. The area C2, which has a radius 32 that is approximately at least 0.2 sigma, may be represented by a filter or any other devices, and may possess a light transmission rate of approximately between about 0% and about 100%. In the present embodiment, the light transmission rate is approximately between about 20% and about 100%. The area A2, which has an inner radius 32 that is approximately at least 0.2 sigma, and an outer radius 34 that is at least approximately 0.7 sigma, may be represented by a filter or any other devices, and may possess a light transmission rate of approximately between about 0% and about 100%. In the present embodiment, the light transmission rate is approximately between about 20% and about 100%.

Figure 5:
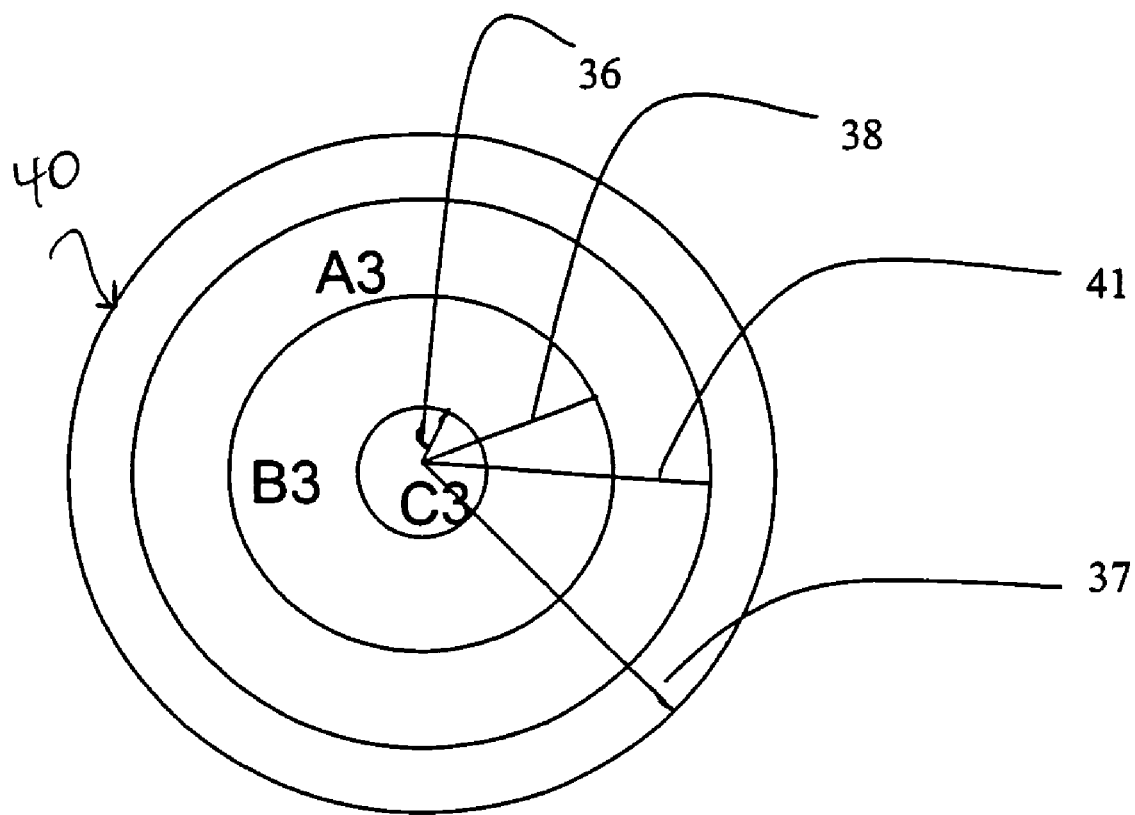

Referring now to FIG. 5, in another example, a first substantially circular area C3 and two torus-shaped areas (A3 and a second torus-shaped area B3) have been formed within an illumination area 40 with a radius 37 of about 1 sigma. The area C3, which has a radius 36 that is approximately at least 0.2 sigma, may be represented by a filter or any other devices, and may possess a light transmission rate of approximately between about 0% and about 100%. In the present embodiment, the light transmission rate is approximately between about 20% and about 100%.

The area B3 is adjacent to the first substantially circular area C3. The area A3 is not adjacent to the first substantially circular area C3. The area A3 has an inner radius 38 that is greater than approximately 0.2 sigma, and an outer radius 41 that is approximately at least 0.7 sigma. The area A3 may be represented by a filter or any other devices, and may possess a light transmission rate of approximately between about 0% and about 100%. In the present embodiment, the light transmission rate is approximately between about 20% and about 100%. It is noted that the area B3 that is between the areas A3 and C3 may have a light transmission rate of about 0%.

Figure 6:
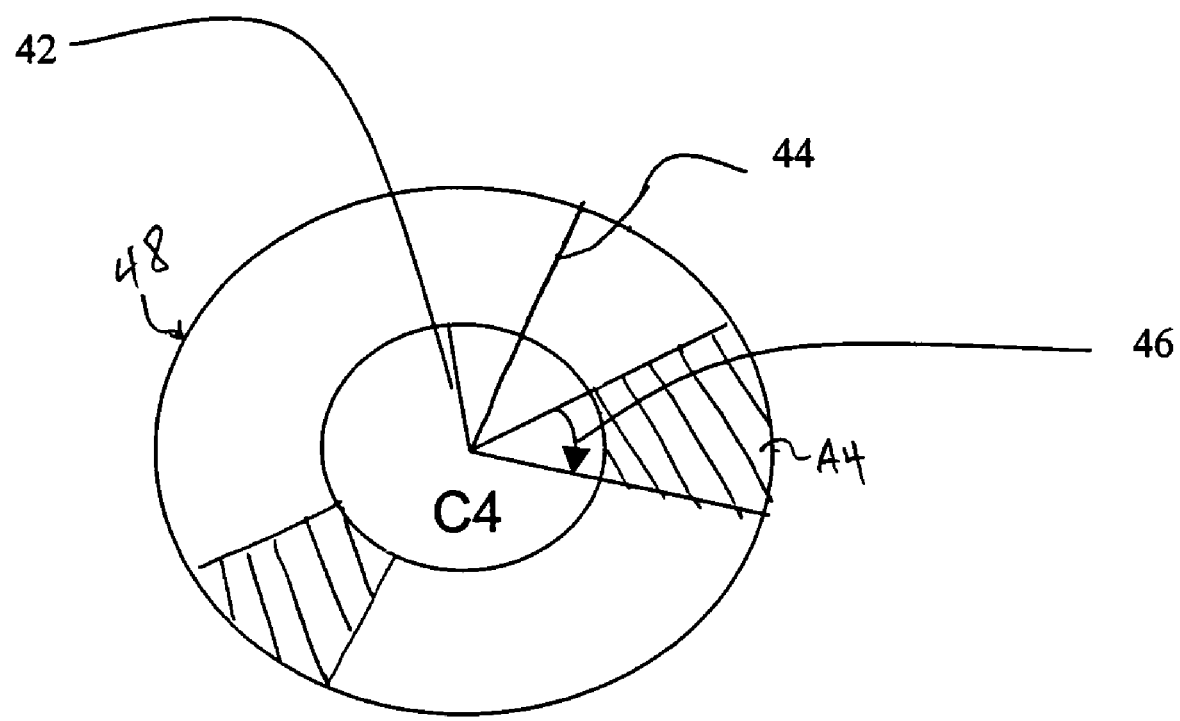

Referring now to FIG. 6, in one example, a first substantially circular area C4 and a plurality of second areas A4 around the circumference of the area C4 have been formed within an illumination area 48. The area C4, which may have a radius 42 of about at least 0.2 sigma, may be represented by a filter or any other devices, and may possess a light transmission rate of approximately between about 0% and about 100%. In the present embodiment, the light transmission rate is approximately between about 20% and about 100%.

It is contemplated that each of the areas A4 may be identical or different, and only a single area A4 may be present. In the present example, at least one of the areas A4 may have an inner radius 42 that is approximately at least 0.2 sigma, and an outer radius 44 that is approximately at least 0.7 sigma. It is noted that at least one of the areas A4 may be represented by a filter or any other devices, and may possess a light transmission rate of approximately between about 0% and about 100%. In the present embodiment, the light transmission rate is approximately between about 20% and about 100%. In one embodiment, an angle 46 is at least about 30 degrees.

Figure 7:
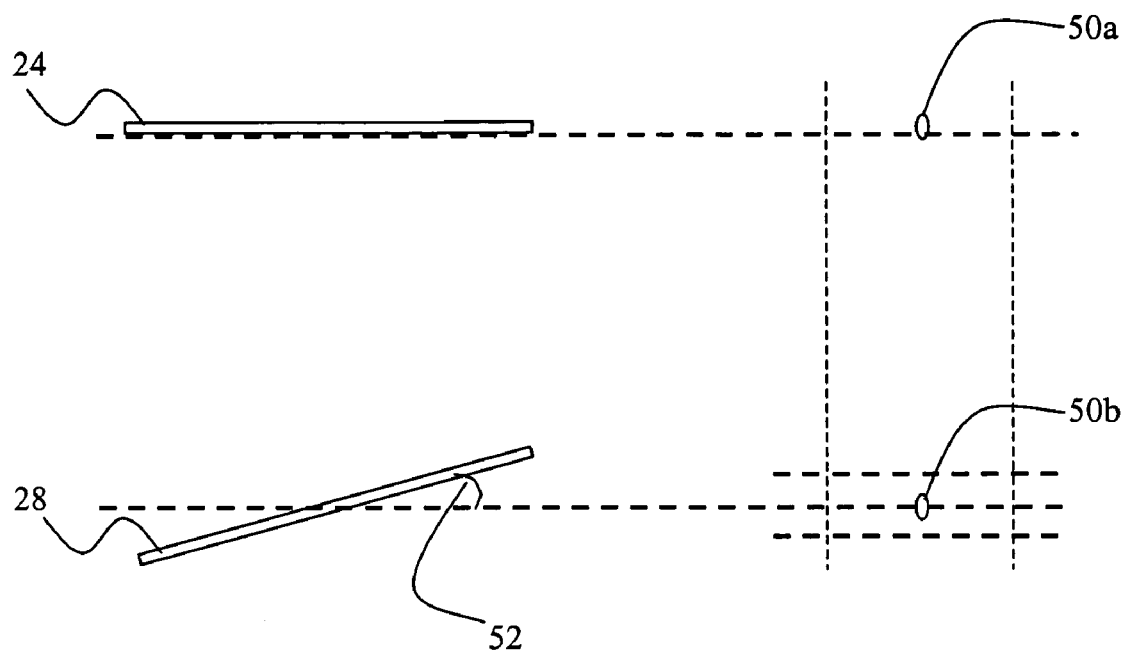
FIG. 7 illustrates selected components of the photolithography system of FIG. 2 for implementing one or more embodiments of the present invention.

The focus drift exposure method will now be further described. Referring now to FIG. 7, in one example, the wafer 28 may be tilted at an angle 52, which is between about 30 and about 250 micro radians (urad), for purposes of exposing the wafer 28. For illustration purposes, a pattern 50*a* from the mask may be formed on the wafer 28 as a corresponding pattern 50*b*.

Figure 8:
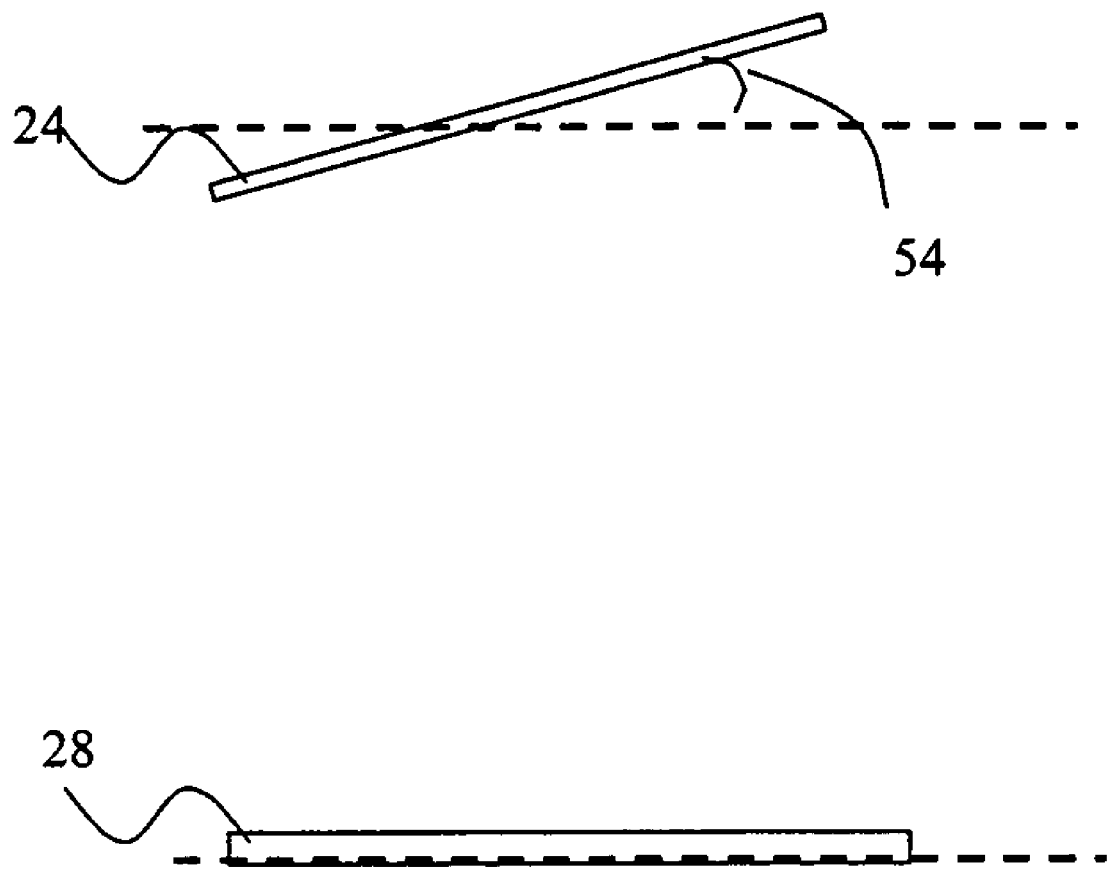
FIG. 8 illustrates selected components of the photolithography system of FIG. 2 for implementing one or more embodiments of the present invention.

Referring to FIG. 8, in another example, the mask 24 may be a high precision plate containing microscopic images of electronic circuits. The mask 24 may include a variety of materials, such as quartz, soda lime, white crown, and/or other materials. Generally, a layer of chrome may be included on one side of the mask 24, and electronic circuits (frequently referred to as geometry) may be etched in the chrome layer. The thickness of the mask 24 may be any suitable thickness known in the art. In one example, the mask 24 may be tilted at an angle 54, which is between about 120 and about 1000 milli-radians (mrad), for purposes of exposing the wafer 28. It is contemplated that both the mask 24 and the wafer 28 may be titled tilted for an identical exposure process.

In furtherance of the example, the focus drift exposure method may include at least two exposures, which may be used independently or in combination with the structures of FIG. 7 and/or FIG. 8. The multiple exposures may be accomplished by scanning or static methods, and/or other methods known in the art. In one example, the focus ranges for first and second exposures may be approximately between about 0.1 mm and about 0.6 mm. In a second example, the focus difference between multiple exposures may be between about 0.1 mm and about 0.4 mm. However, it is noted that other focus ranges/differences are also contemplated by the present disclosure. Since multiple exposures are known in the art, they will not be further described herein.

Figure 9:
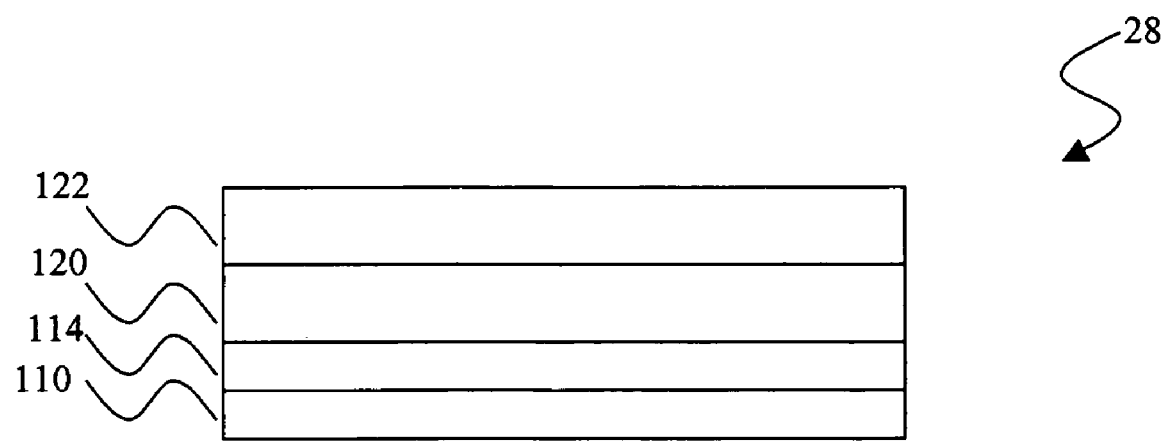
FIG. 9 illustrates a wafer for implementing one or more embodiments of the present invention.

Referring now to FIG. 9, for the sake of example, the wafer 28 of FIG. 2 is expanded to include a substrate 110, a dielectric layer 114, an anti-reflective coating layer 120, and a photoresist layer 122.

The substrate 110 may include one or more insulator, conductor, and/or semiconductor layers. For example, the substrate 110 may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the substrate 110 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The substrate 110 may also or alternatively include a multiple silicon structure or a multilayer compound semiconductor structure.

The dielectric layer 114 may be deposited over the surface of the substrate 110. The dielectric layer 114 may be formed by chemical vapor deposition (CVD), plasma-enhanced CVD (PECVD), atomic layer deposition (ALD), physical vapor deposition (PVD), spin-on coating and/or other processes. The dielectric layer 114 may be an inter-metal dielectric (IMD), and may include low-k materials, silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, and/or other materials.

The anti-reflective coating layer 120 may be deposited over the dielectric layer 114 by a variety of techniques, including but not limited to spin-on coating, PVD, CVD, and/or other processes. In another embodiment, the anti-reflective coating layer 120 is formed by a dual arc approach, for example, one spin-on ARC film is coated on another CVD ARC film. In the present embodiment, the layer 120 is a bottom anti-reflective coating (BARC) with a thickness between 10 nm to 150 nm.

In the present embodiment, the anti-reflective coating layer 120 absorbs the light that inadvertently penetrates the bottom of a photoresist layer (not shown). To perform the light absorption, the anti-reflective coating layer 120 may include a material with a high extinction coefficient, and/or considerable thickness. On the other hand, a high coefficient of the anti-reflective coating layer 120 may lead to the high reflectivity of the anti-reflective coating layer, which counters the effectiveness of the anti-reflective coating layer 120. Accordingly, it is contemplated that the anti-reflective coating layer 120 may possess a coefficient value at approximately between about 0.2 to about 0.5, and may possess a thickness of about 200 nm. However, it is noted that other ranges of coefficient values and thickness are also contemplated by the present disclosure.

Additionally or alternatively, an index matching approach may be adopted for the anti-reflective coating layer 120. In that case, the anti-reflective coating layer 120 may include a material with a refraction index and thickness that match those of the light. In operation, once the light strikes the anti-reflective coating layer 120, a portion of the light is reflected therefrom. Meanwhile, another portion of the light enters the anti-reflective coating layer 120 and is transformed into a light with a shifted phase, which interferes with the first portion of the light that is reflected from the anti-reflective coating layer 120, resulting in the reduction of the light reflectivity.

It is contemplated that the anti-reflective coating layer 120 may employ both the light absorption and index matching approaches to achieve the desired results. In some instances, the anti-reflective coating layer 120 may simply remain over the dielectric layer 114 and serve as a diffusion barrier for the wafer 18, as the removal of the anti-reflective coating layer 120 may be difficult to accomplish.

The photoresist layer 122 may be deposited over the anti-reflective coating layer 120, and formed by spin-on coating and/or other processes. In operation, a photoresist solution is dispensed onto the surface of a partial wafer, and the wafer 28 is spun rapidly until the photoresist solution is almost dry. In one example, the photoresist layer 112 may be a chemically amplified resist that employs acid catalysis. In that case, the photoresist layer may be formulated by dissolving an acid sensitive polymer in a casting solution.

Following the deposition of the photoresist layer 122, the wafer 28 may undergo a soft bake (known in the art) and an exposure process (described above in connection with the method 10).

Thereafter, additional steps are adopted for forming a complete semiconductor device. Since those additional steps are known in the art, they will not be further described herein.

It is noted that many variations of the above example are contemplated herein. In one example, the method 10 may be applied to patterns that include at least one line. In a second example, the method 10 may be applied to patterns that include at least one hole. In a third example, the method 10 may be applied to patterns that include dense and isolated features. In a fourth example, the method 10 may be applied to patterns that include dense features. In a fifth example, the method 10 can be used as part of a non-damascene, damascene or dual-damascene process. Therefore, a variety of modifications are contemplated by this disclosure.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for semiconductor manufacturing, comprising:
   providing a substrate;
   coating a photo resist layer on the substrate; and
   exposing the substrate utilizing a combination of high angle illumination and focus drift exposure methods, wherein the focus drift exposure method comprises tilting a mask used for exposing the substrate at an angle that is between about 120 and about 1000 mrad.

2. The method of claim 1, wherein the high angle illumination method includes an off-axis illumination method.

3. The method of claim 1, further including filtering light through an aperture that includes a first region located within an illuminated region, wherein the illuminated region has a substantially circular shape with a radius of about 1 sigma, and the first region has a substantially circular shape with a radius of about 0.65 sigma.

4. The method of claim 1, further including filtering light through an aperture that includes a first region located within an illuminated region, wherein the illuminated region has a substantially circular shape with a radius of about 1 sigma, and the first region has a substantially torus shape with a radius of about 0.7 sigma, wherein the aperture further includes a substantially circular-shaped second region located within the first region, the second region having a radius of about 0.2 sigma and a light transmission rate between about 20% and about 100%.

5. The method of claim 1, further including filtering light through an aperture that includes a first region located within an illuminated region, wherein the illuminated region has a substantially circular shape with a radius of about 1 sigma, and the first region has a substantially torus shape with a radius of about 0.7 sigma, and the aperture further includes:
   a substantially torus-shaped second region located within the first region, the second region having a radius greater than 0.2 sigma and a light transmission rate of about 0%; and
   a substantially circular-shaped third region located within the second region, the third region having a radius of about 0.2 sigma and a light transmission rate between about 20% and about 100%.

6. The method of claim 1, further including filtering light through an aperture that includes a first region located within an illuminated region, wherein the first region of the aperture has a substantially circular shape with a radius of about 0.2 sigma, and the aperture further includes a plurality of second regions located around a circumference of the first region, wherein the plurality of second regions have a radius of about 0.7 sigma and a light transmission rate between about 20% and about 100%.

* * * * *